United States Patent [19]

Rasnake et al.

[11] Patent Number: 5,684,507

[45] Date of Patent: Nov. 4, 1997

[54] METHOD OF DISPLAYING CONTINUOUSLY ACQUIRED DATA ON A FIXED LENGTH DISPLAY

[75] Inventors: William F. Rasnake, Bothell, Wash.; Martin Lutke Schipholt, Almelo, Netherlands

[73] Assignee: Fluke Corporation, Everett, Wash.

[21] Appl. No.: 301,938

[22] Filed: Sep. 7, 1994

[51] Int. Cl.$^6$ ......................................... G09G 5/36
[52] U.S. Cl. ........................................ 345/134; 345/138
[58] Field of Search ........................... 345/134, 138, 345/140, 133, 232, 132, 148; 395/164; 348/448

[56] References Cited

U.S. PATENT DOCUMENTS

| | | | |
|---|---|---|---|
| 4,110,564 | 8/1978 | Andresen | 345/134 |
| 4,143,365 | 3/1979 | Cayzac et al. | 345/134 |
| 4,271,486 | 6/1981 | Dagostino et al. | 365/45 |
| 4,536,760 | 8/1985 | Navarro et al. | 324/121 R |
| 4,634,970 | 1/1987 | Payne et al. | 324/121 R |
| 4,704,605 | 11/1987 | Edelson | 345/136 |
| 4,823,287 | 4/1989 | Thompson | 345/134 |
| 4,849,746 | 7/1989 | Dubner | 345/138 |
| 5,028,914 | 7/1991 | Povenmire | 345/134 |
| 5,065,149 | 11/1991 | Marsh et al. | 345/148 |
| 5,253,041 | 10/1993 | Wine et al. | 348/448 |
| 5,323,173 | 6/1994 | Sakuma et al. | 345/134 |
| 5,339,260 | 8/1994 | Miura | 364/560 |
| 5,384,912 | 1/1995 | Ogrinc et al. | 395/164 |
| 5,530,454 | 6/1996 | Etheridge et al. | 345/134 |

*Primary Examiner*—Richard Hjerpe
*Assistant Examiner*—Vui T. Tran
*Attorney, Agent, or Firm*—Douglas J. Barker

[57] ABSTRACT

A method of displaying continuously acquired measurement data in a display with a fixed number of pixels is provided. Measurement data is provided at a predetermined fixed sample rate independent of a pixel rate which is equal to or less than the sample rate. The measurement data is convened to pixel data which includes the minimum, maximum, and the average of the measurement data gathered and the pixel data is plotted to the pixels at a pixel rate. At the end of the fixed number of pixels of the display, the pixel values are compressed to half the fixed number of pixels and the pixel rate is halved, thereby doubling the time scale. This process can continue indefinitely, requiring no operator intervention or prior knowledge to set a total measurement time. Furthermore, the sample rate is independent of the pixel rate so that a tradeoff of sample rate and total measurement time need not be made.

9 Claims, 5 Drawing Sheets

5,684,507

METHOD OF DISPLAYING CONTINUOUSLY ACQUIRED DATA ON A FIXED LENGTH DISPLAY

BACKGROUND OF THE INVENTION

This invention relates generally to methods of graphically displaying data and specifically to a method for graphically displaying a stream of continuously acquired measurement data using a display with a fixed number of graphical display elements.

Graphical representation of electrical signals over time is a particularly important tool for analysis and troubleshooting. Electrical signals may include simple voltages, such as a.c. (alternating current) power line voltage and current, as well as the output of sensors that measure physical phenomena such as temperature, pressure, acceleration, or physical position, among others. A graphical history of the measured signal provides the user with valuable insight into the behavior of the electrical signal over time, by observing both long term trends and short-term transitory events. For example, power line voltage can be monitored over a twenty four hour period to observe its long term stability while detecting short-term surges and drop-outs.

A variety of instrumentation has been developed to measure electrical signals and display the measurements in graphical form. Strip chart recorders have been used for many years for the task of monitoring of electrical signals over an extended period of time. The selection of recorder speed and the available supply of chart paper determined the length of time the electrical signal could be monitored while the analog bandwidth of the chart recorder amplifier and d'Arsonval meter movement determined the shortest transitory event that could be detected. Analog oscilloscopes, on the other hand, were designed for displaying relatively fast, repetitive waveforms on a cathode ray tube but have generally not been effective at monitoring long-term trends since their ability to store traces and provide a permanent record is limited to taking successive photographs of the oscilloscope screen or repetitively recording the signal data by hand.

Strip chart recorders have largely given way to data acquisition systems, which digitize the electrical signals and store the measurement information as digital data in computer memory. The signal is "sampled" by converting the signal voltage at a designed time into discrete measurement values as represented by digital measurement data using an analog-to-digital converter ("ADC"). Data acquisition systems are often comprised of specialized data acquisition boards that deliver the measurement data to a personal computer ("PC"). The data acquisition board digitizes the input signal and the PC handles the tasks of data collection, storage, and display. Because of fundamental limitations in the amount of data storage available in a PC, the PC-based data acquisition system faces many of the same time limitations of the original strip chart recorder. Instead of chart speed, the user must select a measurement sample rate. A faster sample rate yields higher time resolution measurements but consumes memory at a faster rate. For example, a user hoping to measure a power line signal over a 24 hour period using a data acquisition system with a capacity for storing 240,000 readings may use a sample rate up to 2.8 readings per second. Transient events that occur between samples will be missed entirely. Conversely, increasing the sample rate to capture the fast transient events results in a shorter total measurement time which reduces the ability to capture long term trends.

Analog oscilloscopes have, in turn, largely given way to digital storage oscilloscopes ("DSO's") which are optimized to sample signals much faster than a typical data acquisition system. This increased speed comes at a price of more limited waveform memory depth and fewer bits of voltage resolution. Sampling a signal at a rate fast enough to capture the amplitude of a fast transient signal of interest could quickly exhaust the waveform memory. U.S. Pat No. 4,271,486 "Waveform Storage System" to Dagostino et al. and assigned to Tektronix, Inc., discloses a system by which the sampling rate of the ADC of the instrument is independent of the sweep speed, allowing the ADC to sample as fast as necessary to capture the maximum and minimum amplitudes of the input signal that occur over a selected measurement period. Because the measurement values are not stored unless they fall outside of either of the extremes, the measurement period is unconstrained by the availability of memory because each measurement value produced by the ADC is immediately compared with the current minimum and maximum values maintained with no need for later processing of that measurement value. Subsequently, the measurement value is discarded. Each maximum and minimum value is stored in a respective waveform memory address which corresponds with a graphical display element called a "pixel" of the displayed waveform. Pixels are filled, meaning a memory element in waveform memory is filled with pixel information, at a pixel rate and the total measurement period becomes the total number of pixels divided by the pixel rate. The total measurement period must therefore be determined prior to starting the measurement and no provision is made for maintaining an average of the measurement values.

Therefore, it would be desirable to provide a method of displaying continuously acquired measurement values on a display with a fixed number of pixels which allows for the automatic setting of the time scale such that collected pixel information is compressed into a fraction of the total display as the last pixel is reached, perpetually providing room for new pixel information to be displayed without requiring operator intervention. Pixels are plotted at a sweep rate that is independent of the sample rate. Furthermore, it would be desirable that an average value as well as a minimum value and a maximum value be included in the pixel information and that the compression operation be conducted in such a manner that the minimum, maximum, and average values remain valid.

SUMMARY OF THE INVENTION

In accordance with the present invention, a method of displaying continuously acquired data in a fixed number of pixels is provided. In a measuring instrument, the data represents measurement values which are acquired at a sample rate by an ADC. Independent of the sample rate, an input pixel is calculated at a pixel rate less than or equal to the sample rate. Each pixel represents a time element in a time-ordered display and is a graphical representation of the data stored in a corresponding memory location in the waveform memory. The sample rate and pixel rate are independent and, because no post processing is required of the measurement, it need not be stored individually for later analysis. The measurement values may be processed as fast as necessary, limited by the maximum sampling speed of the ADC and by processing speed of the microprocessor, to capture the waveform characteristics of interest with no missing time periods. As each measurement value is collected, the microprocessor compares the measurement value to the current minimum and maximum values for that pixel and, if the value is a new minimum or maximum value, the microprocessor stores the value as the respective new minimum or maximum value. An average may be calculated at any time by maintaining a running total of all collected measurement values as well as the number of measurement values collected and simply dividing the sum by the number of measurement values. In this way, there are no practical limitations imposed by the availability of data storage on the number of measurement data points that may be collected per pixel.

As each pixel is plotted, the vertical scale of the graphical plot is adjusted if necessary to fully display all pixel information across the display in the maximum number of available vertical pixels. Automatic vertical scaling ensures that the pixel information is displayed in the same scale across the display and is at all times viewable by the operator with no manual intervention to adjust the vertical scale.

As the last pixel in the trace is reached at the end of a complete sweep, the time scale is doubled to twice that of the previous sweep. First, the pixel information previously collected and stored in waveform memory are compressed into the first half of the total available waveform memory. Each memory location contains information that maps into a particular pixel. Second, the newly freed memory locations in the second half of the waveform memory are then available for displaying new pixel information but the pixel rate is now halved so that it matches the effective pixel rate of the previously acquired and now compressed pixels. In a given sweep, therefore, the number of measurement data points used to calculate a pixel, whether currently acquired or compressed, remains constant which allows continuously acquired measurement data to be automatically accommodated over an ever increasing measurement time while maintaining the same time scale for each pixel to provide a useful time series display of the collected measurement for the operator.

No information is lost in the compression process, with each pixel containing the minimum, maximum, and avenge information collected from the measurement values. As two adjacent pixels are compressed into one, the minimum of the two minimum values and the maximum of the two maximum values become the combined minimum and maximum for the new pixel. Similarly, the average of the two pixel avenges is taken which yields the combined average. Compressing the pixel information in this way yields precisely the same minimum, maximum, and avenge values that would have been calculated from the measurement data had the two pixel been combined first before calculating the minimum, maximum, and average of the individual pixels. As can be discerned, the information contained in compressed pixels is equivalent to that of a currently acquired pixel both in the number of measurement values represented in the calculation and also in the results of the processing of the information.

One object of the present invention is to provide a method of displaying continuously acquired measurement data with automatic time scaling that accommodates measurement periods of indefinite length.

Another object of the present invention is to provide a method of displaying continuously acquired measurement data that compresses previously acquired pixels to free up pixels for newly acquired measurement data while maintaining a constant time scale between compressed pixels and newly acquired pixels.

An additional object of the present invention is to provide a method of displaying continuously acquired measurement data that compresses previously acquired pixel information in a manner that retains the validity of the information and maintains a constant number of measurement values per pixel across the display.

Other features, attainments, and advantages will become apparent to those skilled in the art upon a reading of the following description when taken in conjunction with the accompanying drawings.

DETAILED DESCRIPTION OF THE INVENTION

Figure 1:
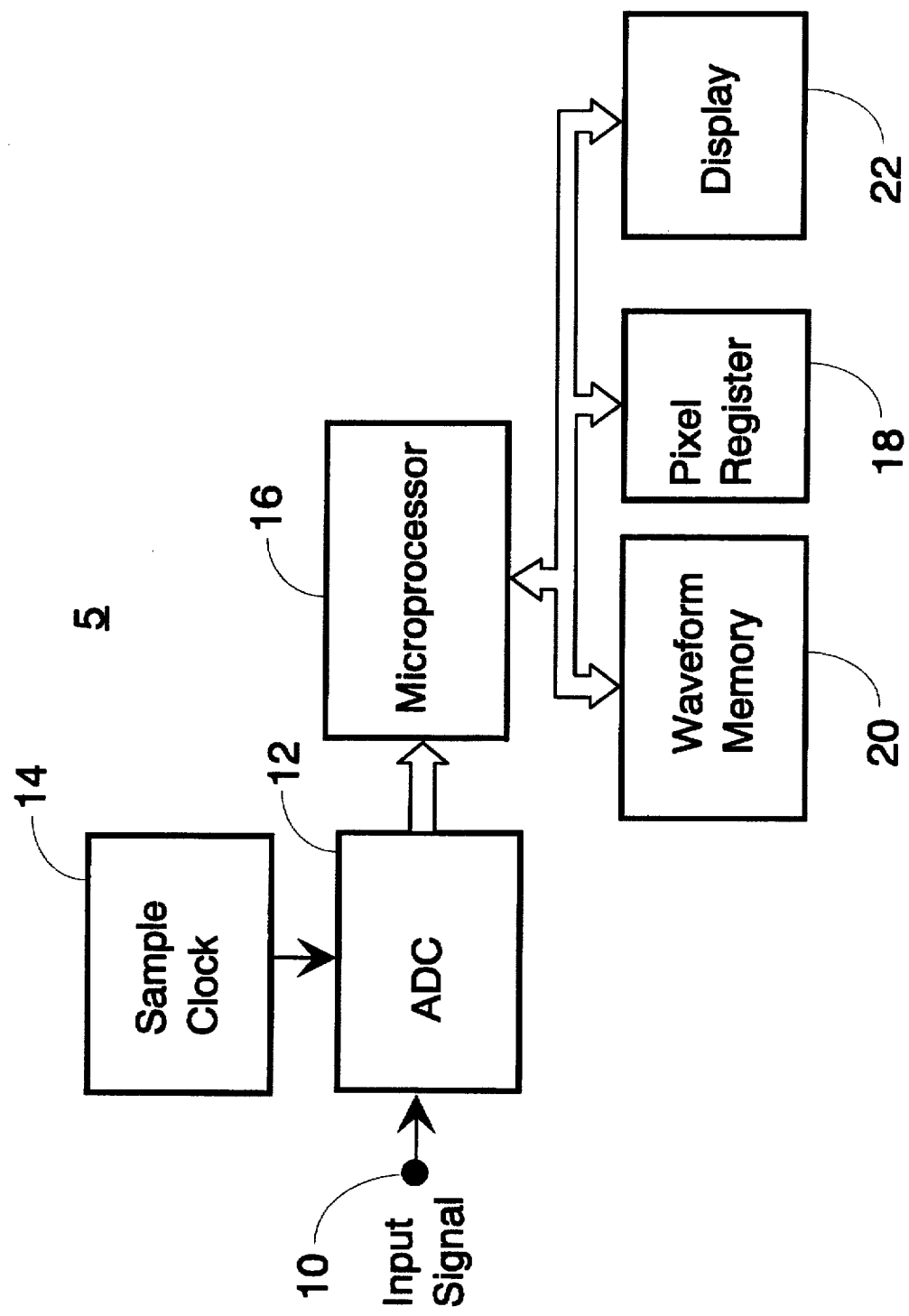
FIG. 1 is a simplified block diagram of a typical measurement system.

Referring now to FIG. 1, there is shown a simplified block diagram of a measurement instrument 5 which is adapted for measuring, collecting, and displaying input signal information. An input signal is coupled to an input terminal 10 which is coupled to an analog-to-digital converter (ADC) 12 which converts the voltage level of the input signal to a digital measurement value responsive to a sample clock 14 coupled to a sample clock input of the ADC 12. The input signal, generally a voltage signal, may be derived from pressure, temperature, velocity, acceleration, or any of variety of other physical phenomena which need to be analyzed for long-term trends and short-term stability. Other sources of measurement data, such as time or frequency data from a frequency counter instrument, are equally appropriate for the present invention. The measurement data from the ADC 12 is coupled to a microprocessor 16 which converts the measurement data directly to pixel information which is stored in a pixel register 18 which contains the measurement information relevant to the current pixel being calculated. A pixel corresponds with a discrete memory location containing various measurement information of the input signal collected from a series of continuously acquired measurement values over a known time period associated with that pixel period. The present invention includes the minimum measured value, the maximum measured value, and the average of all the measured values among the pixel information.

The digital measurement values arrive at the microprocessor 16 at a sample rate governed by the sample clock 14 which is generally controllable by the user. As each measurement value is received by the microprocessor 16, the microprocessor 16 compares the measurement value with the minimum value and the maximum value stored in the pixel register 18. If the measured value is less than the stored minimum value or greater than the stored maximum value, the microprocessor 16 replaces the respective stored value with the measured value. In the preferred embodiment, the sample clock 14 is generally constant but subject to minor variations in the time between samples because of various system constraints such as the load on the microprocessor 16. The average is calculated by the following formula:

$$\text{new average} = \frac{[\text{old average} * \text{elapsed pixel time} + \text{current measured value} * t]}{\text{elapsed pixel time} + t}$$

where the elapsed pixel time is the total time taken to calculate the old average and t is the elapsed time from the last measurement. The old average, elapsed pixel time and elapsed time from the last measurement are maintained in the pixel register. When the pixel information is to be sent to a waveform memory 20, the new average is calculated using the above equation. This equation is a weighted-average function that takes into account the variations in the time t between samples. Alternatively, if the time t were always constant, the new average may be calculated by the simpler formula:

$$\text{new average} = \frac{[\text{sum of all previous values}]}{\text{number of values}}$$

As each measured value arrives, it is then summed with all of the previous measured values and the sum is stored in the pixel register 18. The number of measured values so far accumulated is incremented and stored in the pixel register 18. In this way, an average of the measurement values may be calculated at any point by dividing the sum of the measurement values by the number of measurement values. By immediately processing each measurement value, the burden and expense of storing each measurement value in discrete memory for later analysis is removed. At the pixel rate, the contents of the pixel register 18 are calculated and mined into pixel information and then transferred by the microprocessor 16 to the waveform memory 20. The pixel register 18 and the waveform memory 20 may reside in the same physical memory but at different addresses. A display 22 reads the values stored in the waveform memory 20 and converts the values to a corresponding graphical display. The display 22 may consist of any form of conventional computer display and use a variety of graphing and plotting routines well known in the art to display data stored in memory. It will be obvious that display 22 may consist of a self contained subsystem with its own microprocessor or be merely a rudimentary display device that depends on microprocessor 16 and graphics algorithms well known in the art.

Figure 2:
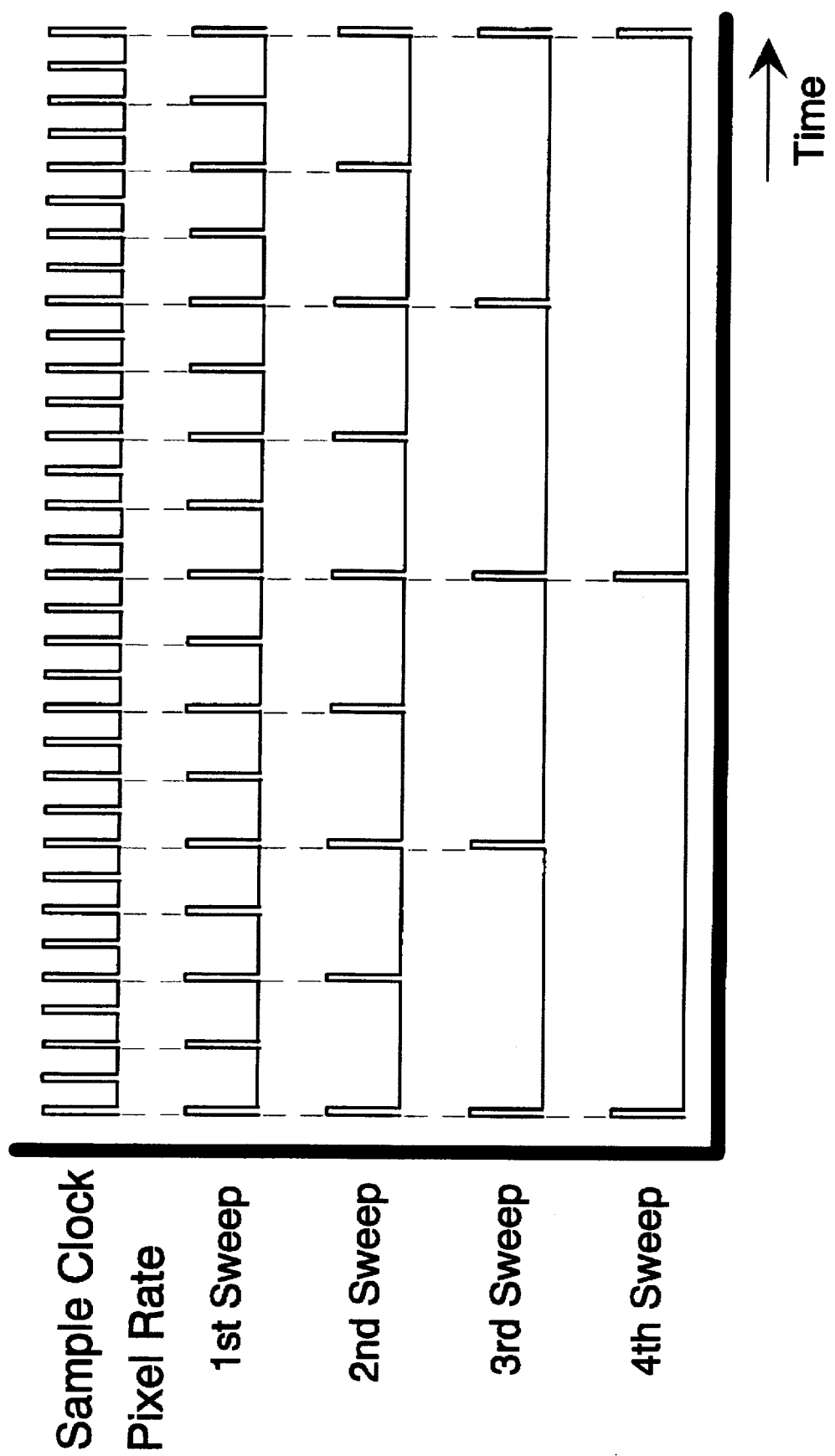
FIG. 2 is a timing diagram showing the relationship of the pixel rates and the sample rate.

Referring now to FIG. 2, there is shown a timing diagram that illustrates the relationship between pixel rates of successive sweeps. The pixel rates are generated by the microprocessor 16 which contains an internal timing routine in firmware that generates the timing signals as shown by keeping track of the current sweep number. The sample clock can operate at a rate independent of the pixel rate if desired but synchronization between the pixel rate and sample rate may be desirable. If the sample rate and pixel rate operate asynchronously, the number of measurement data points for any particular pixel has a plus or minus one uncertainty. For example, a first pixel may be calculated using 301 collected data points while the following pixel may be calculated with only 299 collected data points. A separate clock circuit for timing the pixel rate may also be employed. In the preferred embodiment, the sample rate was made to operate synchronously with the pixel rate to eliminate the plus or minus one point uncertainty because the first sweep involved only two measurement values per pixel. As the first sweep ends, the pixel rate is for second sweep to produce a new pixel rate, resulting in twice as many measurement values being processed to yield the pixel information. The number of measurement values per pixel continues to double on each successive sweep, thus causing the effective time scale to double on each sweep. The sample rate of the preferred embodiment is four measurements per second. The pixel rate is two pixels per second for a total time of 120 seconds for the first sweep. The second sweep is 240 seconds total, the third sweep is 480 seconds total, and so on. Two measurement values are used for each pixel in the first sweep, four measurement values in the second, eight measurement values in the third, and so on.

Figure 3:
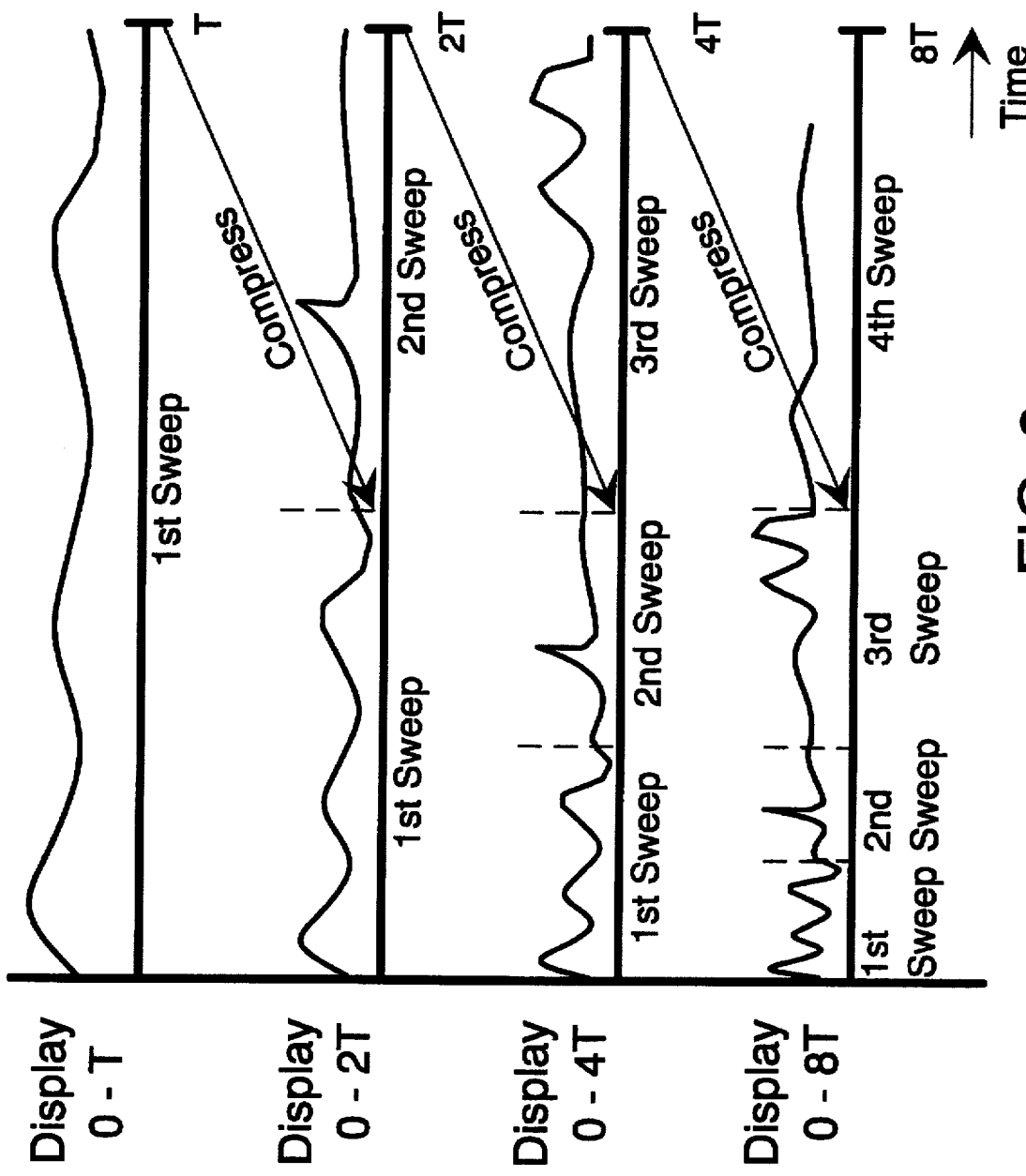
FIG. 3 is an illustration of the method of displaying continuously acquired measurement data according to the present invention.

Referring now to FIG. 3, there is shown a simulated waveform display such as would appear on the display 22 responsive to the contents of the waveform memory 20 which illustrates the present invention in operation over four successive sweeps. Only a single trace, which plots only one type of pixel information such as an average, is shown for simplicity but multiple traces, such as the maximum and minimum, may also be included. The first sweep occurs over a measuring time 0 to T. As the measurement continues from T to 2T, the display is adjusted to a horizontal time scale of 0 to 2T to accommodate the longer time, first by compressing the pixel information gathered over the first period T into the pixels on the first half of the display. Second, the pixel rate is halved and pixel information continues to accumulate and is plotted to free pixels starting at the midpoint of the display. As the measurement continues from 2T to 4T, the display is again adjusted, now to a horizontal time scale of 0 to 4T in a similar manner. The pixel information gathered over the first and second sweeps are thus preserved but at an attendant loss in time resolution. As the measurement continues from 4T to 8T, the display is again adjusted as before. In this way, the method of displaying continuously acquired measurement values according to the present invention can operate over an indefinite measurement time period.

Figure 4:
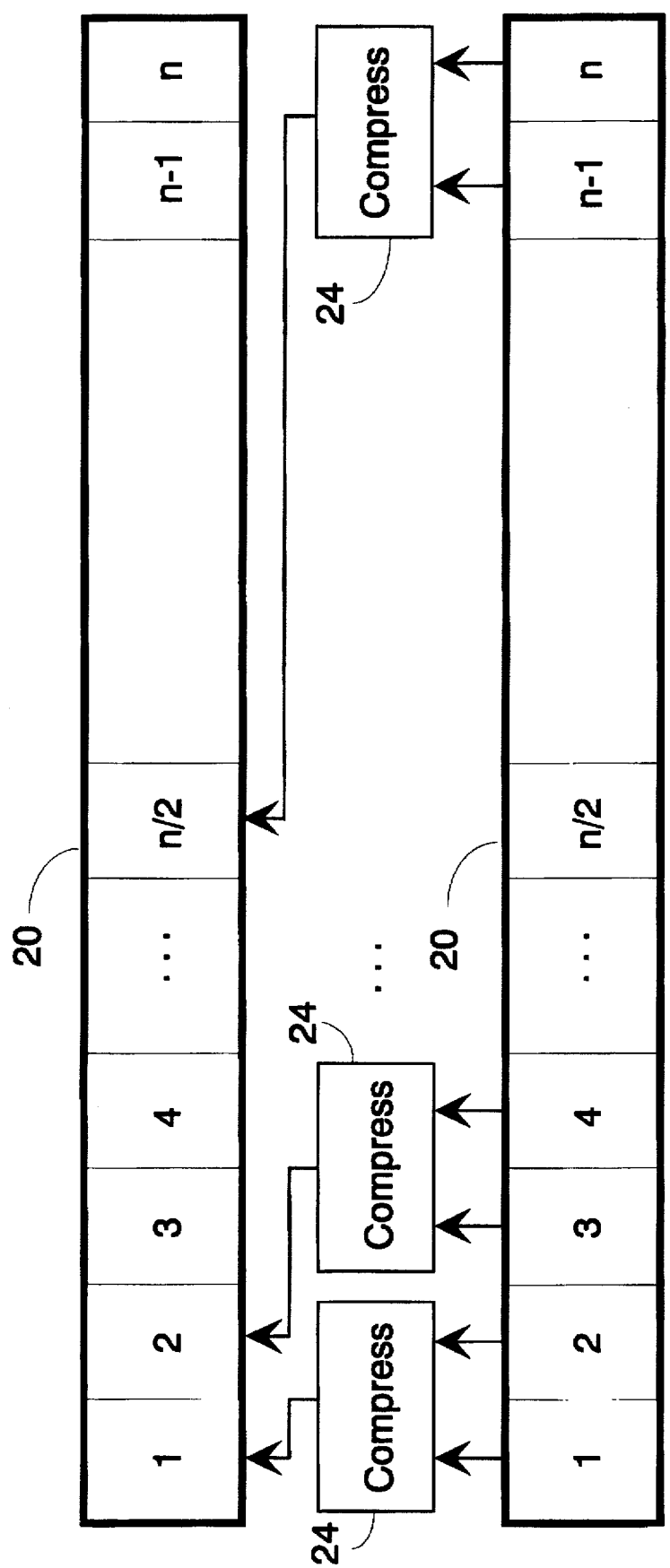
FIG. 4 is an illustration of the compression process as done in waveform memory.

Referring now to FIG. 4, there is shown a simplified flow diagram of the compression process involving the pixel information stored in the waveform memory 20 which is shown in FIG. 1. Each location of the waveform memory 20 corresponds to a pixel that is plotted to the display 22. The compression ratio is the ratio of the number of old pixels to the number of new compressed pixels. A compression ratio of 2 to 1 means that the pixel information displayed in a certain number of pixels will be compressed into half as many pixels, with the other half becoming free pixels which can be used to display newly acquired pixel information. Compressing pixels is a mathematical operation involving the pixel information stored in the waveform memory 20. Compressing the pixels into the first half of the display involves combining the pixel information contained in adjacent pixels, such as pixels 1 and 2, 3 and 4, 5 and 6, and so on in an operation 24 labeled COMPRESS. The operation 24 is performed multiple times until the original n pieces of pixel information are compressed into n/2 pixels. The operation 24 is performed by the microprocessor 16 and the same memory 20 may be employed for storing the newly compressed pixel information. The nature of the operation 24 to perform the compression while maintaining the validity of the compressed information depends on the type of pixel information being compressed. In the preferred embodiment, the microprocessor 16 compares the maximum values stored in the waveform memory 20 for each pixel and selects the largest one which is then stored in the memory location of the first pixel. Similarly, the microprocessor 16 compares the minimum values stored in the waveform memory 20 for each pixel and selects the lowest one which is then stored in the memory location of the first pixel. Finally, the microprocessor 16 performs an average of the two average values stored in the waveform memory 20 for each pixel and stores the combined average value in the memory location of the first pixel. The compressed information remains valid because the operation 24 does not affect the way the information is calculated. For example, taking the maximum of the two maximums yields the same result for a given set of measurement values regardless of the number of intervening compression operations.

The compressed pixel information from pixels 3 and 4 is stored in the memory location corresponding to pixel 2 and so on until the n pixels have been compressed into n/2 pixels. For simplicity, n is assumed to be an even number. The compressed pixel information contained in the waveform memory 20 is now plotted on the display 22. Newly calculated pixel information continues to be plotted, starting at the midpoint of the display and using the free pixels created by the compression operation. The pixel rate of the newly acquired pixels is reduced according to the compression ratio to match the equivalent pixel rate of the compressed pixels. With a compression ratio of 2 to 1, the pixel rate is reduced to one half its value for the newly acquired pixels following a compression operation.

Figure 5:
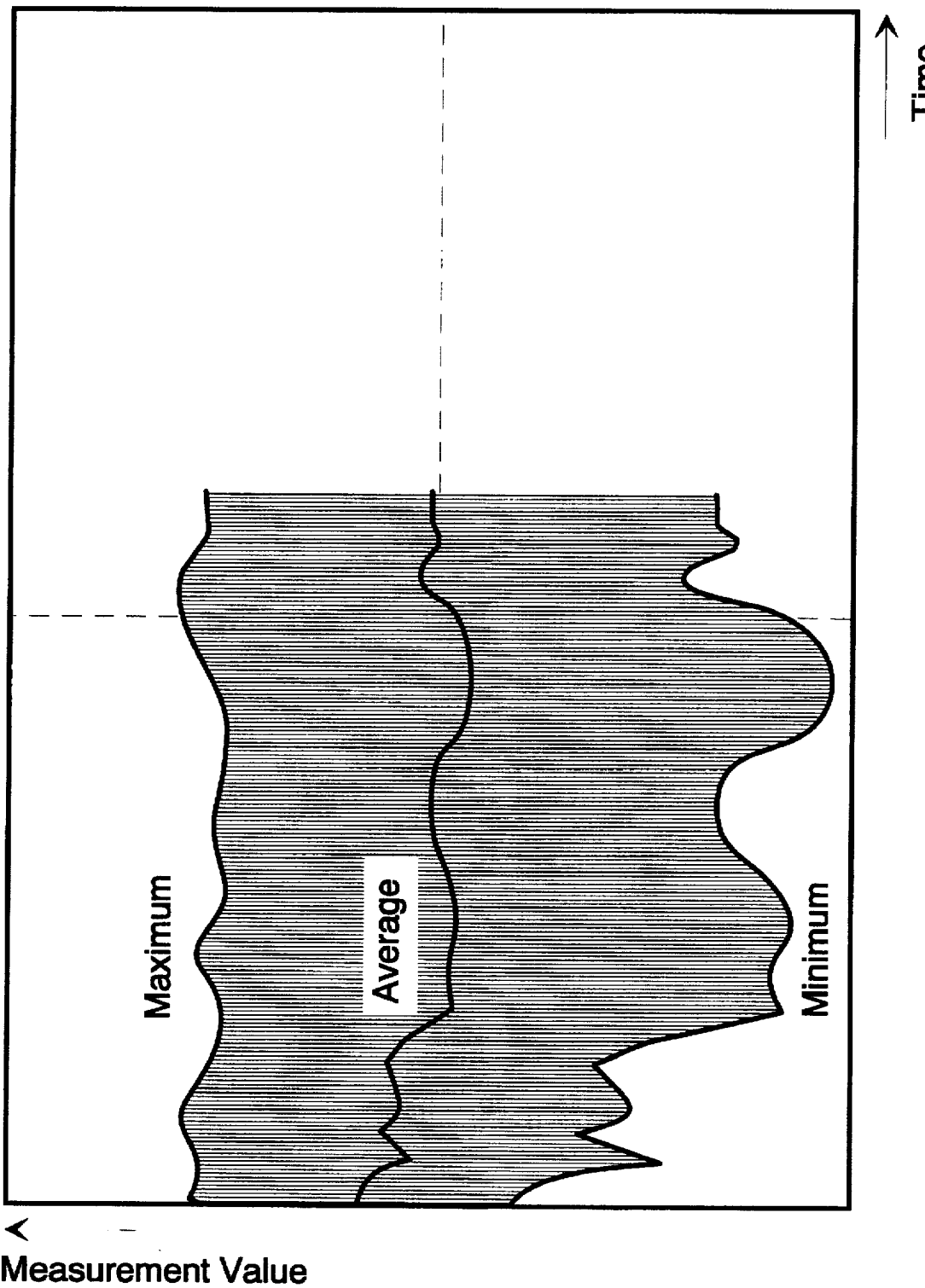
FIG. 5 shows a commercial embodiment of the present invention that simultaneously displays the minimum, maximum, and average values on an LCD display.

Referring now to FIG. 5, there is shown the output of a typical display in which the minimum, maximum, and average values are plotted simultaneously and in such a way as to impart useful information to the user. The vertical axis represents the measurement value for the pixel information with units that depend on the nature of the measurement information. The horizontal axis is in units of time and the time scale is a function of the total elapsed time of the measurement. The pixels are plotted from left to right, the rightmost pixel being the most recently acquired. The long term trend of the measurement values is shown by visually inspecting the graph of the average. The short term stability of the measurement values for any pixel measurement period can be quickly determined by observing the minimum and maximum values for any given pixel. The shading which connects the maximum and minimum values serves to provide an "envelope" which allows the user to quickly develop an understanding of the short term stability of the data over time by visually interpreting the width of the envelope for any given pixel. The amplitude scale is adjusted as required to fully display all the pixel information with the maximum amount of vertical pixel resolution possible. Such techniques of vertical amplitude scaling are well known in the art. The preferred embodiment uses a display 22 which consists of a dot matrix liquid crystal display (LCD) consisting of 240 pixels and associated driver circuitry which requires a separate microprocessor to perform the necessary graphics plotting functions. The shading is accomplished by the use of an LCD display that provides for both half and full brightness characters. Such shading may be accomplished by many other methods of creating contrast, including the use of different colors or shading patterns.

It will be obvious to those having ordinary skill in the art that many changes may be made in the details of the above described preferred embodiments of the invention without departing from the spirit of the invention in its broader aspects. For example, other compression ratios such as 3 to 1 instead of 2 to 1 may be used as needed. Pixel information may include other types and functions that are amenable to compression while remaining substantially valid regardless of the number of times the pixel information is compressed. Any type of continuously acquired data, whether from an analog or a digital source, whether or not derived from physical phenomenon, that requires a visual display of its value will benefit from this display method. Therefore, the scope of the present invention should be determined by the following claims.

What I claim as my invention is:

1. A method for displaying continuously acquired measurement data on a display having a fixed number of pixels along a horizontal time scale comprising:
   (a) calculating pixel information from said continuously acquired measurement data which is acquired at a sample rate;
   (b) plotting said pixel information to free pixels of said display at a pixel rate along said horizontal time scale which is less than or equal to said sample rate;
   (c) at the end of each sweep along said horizontal time scale, compressing said pixel information into a portion of said fixed number of pixels according to a compression ratio wherein a remaining portion of said fixed number of pixels become said free pixels and said pixel information remains valid; and
   (d) reducing said pixel rate according to said compression ratio.

2. A method for displaying continuously acquired measurement data according to claim 1 wherein said compression ratio is two to one.

3. A method for displaying continuously acquired measurement data according to claim 1 wherein said pixel information comprises a minimum value, a maximum value, and an average value.

4. A method for displaying continuously acquired measurement data according to claim 3 wherein said minimum value, said maximum value, and said average value remain valid after compressing said pixel information.

5. A method for displaying continuously acquired measurement data according to claim 3 wherein said minimum value, said maximum value, and said average value are plotted to a graphical display.

6. A method for displaying continuously acquired measurement data on a display having a fixed number of pixels along a horizontal time scale comprising:
   (a) calculating pixel information from said continuously acquired measurement data which is acquired at a sample rate;
   (b) plotting said pixel information to free pixels of said display at a pixel rate along said horizontal time scale which is less than or equal to said sample rate;
   (c) at the end of each sweep along said horizontal time scale, compressing said pixel information into a first half of said fixed number of pixels according to a compression ratio wherein a second half of said fixed number of pixels become said free pixels and said pixel information remains valid; and
   (d) reducing said pixel rate by one half.

7. A method for displaying continuously acquired measurement data according to claim 6 wherein said pixel information comprises a minimum value, a maximum value, and an average value.

8. A method for displaying continuously acquired measurement data according to claim 7 wherein said minimum value, said maximum value, and said average value remain valid after compressing said pixel information.

9. A method for displaying continuously acquired measurement data according to claim 7 wherein said minimum value, said maximum value, and said average value are plotted to a graphical display.

* * * * *